United States Patent [19]
Lee et al.

[11] Patent Number: 5,719,810
[45] Date of Patent: Feb. 17, 1998

[54] SEMICONDUCTOR MEMORY DEVICE HAVING CACHE MEMORY FUNCTION

[75] Inventors: Jae Jin Lee; Seung Han Ahn, both of Kyoungki-do, Rep. of Korea

[73] Assignee: Hyundai Electronics Industries Co., Ltd., Kyoungki-Do, Rep. of Korea

[21] Appl. No.: 548,212

[22] Filed: Oct. 25, 1995

[30] Foreign Application Priority Data

Oct. 25, 1994 [KR] Rep. of Korea .............. 1994-27206
Nov. 24, 1994 [KR] Rep. of Korea .............. 1994-31107

[51] Int. Cl.$^6$ .................................................. G11C 7/00
[52] U.S. Cl. ..................... 365/189.02; 365/189.03; 365/189.05; 365/189.07
[58] Field of Search .................... 365/189.02, 189.03, 365/189.05, 189.07

[56] References Cited

U.S. PATENT DOCUMENTS

| | | | |
|---|---|---|---|
| 5,483,660 | 1/1996 | Yishay et al. | 365/189.02 |
| 5,497,347 | 3/1996 | Feng | 365/189.02 |
| 5,502,683 | 3/1996 | Marchioro | 365/189.02 |

Primary Examiner—David C. Nelms
Assistant Examiner—Michael T. Tran
Attorney, Agent, or Firm—Merchant Gould Smith Edell Welter & Schmidt

[57] ABSTRACT

A semiconductor memory device comprising a memory cell array for storing input data therein, a data output buffer for outputting the data stored in the memory cell array externally, an output terminal for transferring the output data from the data output buffer externally, a data input buffer for transferring the output data from the data output buffer to the memory cell array, a data register for temporarily storing the transferred data from the data input buffer, and a multiplexer connected among the memory cell array, the data register and the data output buffer, for selecting one of the data stored in the memory cell array and the data stored in the data register and transferring the selected data to the data output buffer. In the normal case, the multiplexer selects the data stored in the memory cell array and transfers the selected data to the data output buffer. In a specific case where the input data to the memory cell array have the same values or a regularity, the multiplexer selects the data stored in the data register and transfers the selected data to the data output buffer.

8 Claims, 3 Drawing Sheets

SEMICONDUCTOR MEMORY DEVICE HAVING CACHE MEMORY FUNCTION

BACKGROUND OF THE INVENTION

1. Field of the Invention

The present invention relates in general to semiconductor memory devices, and more particularly to a semiconductor memory device having a cache memory function, which is capable of storing successive data signals with a regularity.

2. Description of the Prior Art

Referring to FIG. 1, there is shown a partially detailed circuit diagram of a conventional semiconductor memory device having read and write functions, such as a dynamic random access memory (referred to hereinafter as DRAM). As shown in this drawing, the conventional semiconductor memory device comprises a memory cell array 100 for storing input data therein, and a data output buffer 101 for outputting the data stored in the memory cell array 100. To this end, the data output buffer 101 includes two NAND gates G100 and G102, two inverters G101 and G103, a pull-up PMOS transistor MP100 and a pull-down NMOS transistor MN100.

The conventional semiconductor memory device further comprises a data input buffer 102 for transferring the output data from the data output buffer 101 to the memory cell array 100. To this end, the data input buffer 102 includes a NAND gate G104 and an inverter G105.

The operation of the conventional semiconductor memory device with the above-mentioned construction will hereinafter be described with reference to FIG. 1.

When a read signal is applied to the memory cell array 100, a data signal is read therefrom and then transferred to a node N100. The data signal at the node N100 is supplied to the NAND gate G100 and the inverter G101 in the data output buffer 101. Then in the data output buffer 101, the NAND gate G100 transfers the data signal at the node N100 to a node N101 in response to a read enable signal oe. Assuming that the data signal at the node N100 is high in logic and the read enable signal oe is high in logic, the data signal at the node N101 is low in logic. The low logic signal at the node N101 is applied to a gate of the pull-up PMOS transistor MP100 to turn it on. As the pull-up PMOS transistor MP100 is turned on, it transfers the data signal read from the memory cell array 100 to a node N103. On the other hand, the inverter G101 inverts the data signal at the node N100 and outputs the inverted signal to the NAND gate G102. Because the data signal at the node N100 is high in logic and the read enable signal oe is high in logic, the NAND gate G102 outputs a high logic signal to the inverter G103. As a result, the inverter G103 applies a low logic signal to a gate of the pull-down NMOS transistor MN100 to turn it off.

The data signal at the node N103 is transferred to an output terminal dq. The data signal at the node N103 is also transferred to the memory cell array 100 through the NAND gate G104 and the inverter G105 in the data input buffer 103. As a result, the data signal at the node N103 is stored in the memory cell array 100.

In this manner, the circuit components are sequentially operated with respect to each data for the data read and write operations of the memory cell array. In this connection, although the data have the same values or a regularity, they must be processed respectively. As a result, much time is required in recognizing data. Also, faulty data is able to be read from the memory cell array when it is accessed after the write operation. Further, an external data bus must be driven, resulting in an increase in the operating time.

SUMMARY OF THE INVENTION

Therefore, the present invention has been made in view of the above problems, and it is an object of the present invention to provide a semiconductor memory device in which a pattern of data with a regularity is temporarily stored in a data register when they are applied to a memory cell array, and the data pattern stored in the data register is directly outputted externally for a read operation without operating the memory cell array, thereby enhancing the operating speed and the data reliability and reducing the power consumption.

It is another object of the present invention to provide a semiconductor memory device in which data stored in a memory cell array is compared with that stored in a data register to facilitate a test mode operation of the semiconductor memory device.

In accordance with one aspect of the present invention, there is provided a semiconductor memory device comprising a memory cell array for storing input data therein; a data output buffer for outputting the data stored in the memory cell array externally; an output terminal for transferring the output data from the data output buffer externally; a data input buffer for transferring the output data from the data output buffer to the memory cell array; data storage means for temporarily storing the transferred data from the data input buffer; and multiplexing means connected among the memory cell array, the data storage means and the data output buffer, for selecting one of the data stored in the memory cell array and the data stored in the data storage means and transferring the selected data to the data output buffer.

In accordance with another aspect of the present invention, there is provided a semiconductor memory device comprising an input terminal for inputting data; a memory cell array for storing the input data from the input terminal; an output terminal for transferring the data stored in the memory cell array externally; data storage means for temporarily storing the input data from the input terminal or output data from the memory cell array; first multiplexing means for selecting one of the input data from the input terminal and output data from the data storage means and transferring the selected data to the memory cell array; and second multiplexing means for selecting one of the input data from the input terminal and the output data from the memory cell array and transferring the selected data to the data storage means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
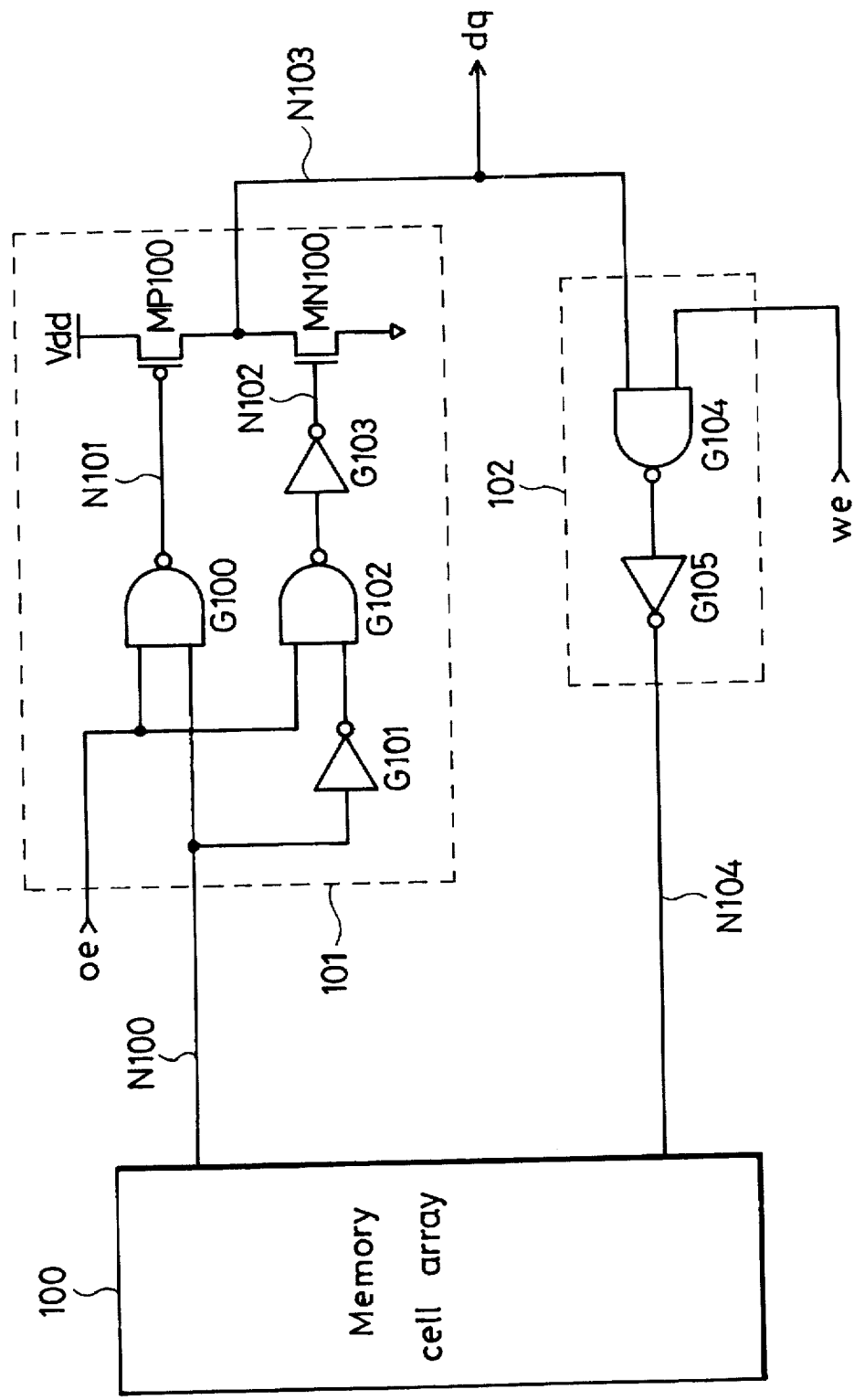
FIG. 1 is a partially detailed circuit diagram of a conventional semiconductor memory device having read and write functions.
Figure 2:
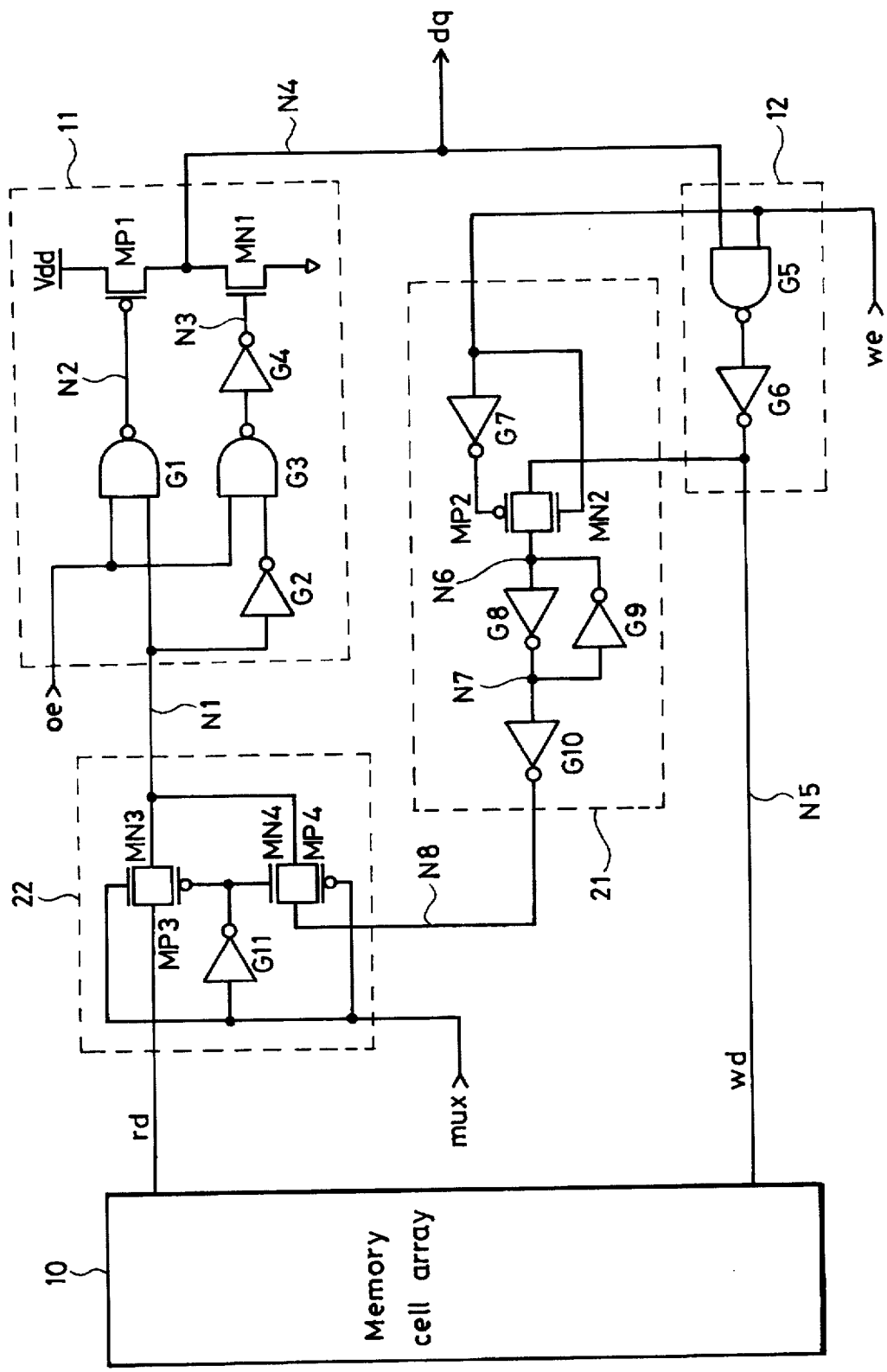
FIG. 2 is a partially detailed circuit diagram of a semiconductor memory device in accordance with an embodiment of the present invention.

Referring to FIG. 2, there is shown a partially detailed circuit diagram of a semiconductor memory device in accordance with an embodiment of the present invention. As shown in this drawing, the semiconductor memory device comprises a memory cell array 10 for storing input data therein, and a data output buffer 11 for outputting the data stored in the memory cell array 10. To this end, the data output buffer 11 includes two NAND gates G1 and G3, two inverters G2 and G4, a pull-up PMOS transistor MP1 and a pull-down NMOS transistor MN1.

The semiconductor memory device further comprises a data input buffer 12 for transferring the output data from the data output buffer 11 to the memory cell array 10. To this end, the data input buffer 12 includes a NAND gate G5 and an inverter G16.

The semiconductor memory device further comprises a data register 21 for temporarily storing the output data from the data input buffer 12. To this end, the data register 21 includes four inverters G7 to G10, a PMOS transistor MP2 and an NMOS transistor MN2.

The semiconductor memory device further comprises a multiplexer 22 connected among the memory cell array 10, the data register 21 and the data output buffer 11. The multiplexer 22 acts to select one of the data stored in the memory cell array 10 and the data stored in the data register 21 and transfers the selected data to the data output buffer 11. To this end, the multiplexer 22 includes an inverter G11, two PMOS transistors MP3 and MP4 and two NMOS transistors MN3 and MN4.

The operation of the semiconductor memory device with the above-mentioned construction in accordance with the embodiment of the present invention will hereinafter be described in detail with reference to FIG. 2.

First, a data signal rd is read from the memory cell array 10 and then applied to the multiplexer 22. In the multiplexer 22, the PMOS transistor MP3 is turned on when a multiplex control signal mux is high in logic. When turned on, the PMOS transistor MP3 transfers the read data signal rd to a node N1. The data signal at the node N1 is supplied to the NAND gate G1 and the inverter G2 in the data output buffer 11.

In the data output buffer 11, the NAND gate G1 transfers the data signal at node N1 to a node N2 in response to a read enable signal oe. Assuming that the data signal at the node N1 is high in logic and the read enable signal oe is high in logic, the data signal at the node N2 is low in logic. On the other hand, the inverter G2 inverts the data signal at the node N1 and outputs the inverted signal to the NAND gate G3. Because the data signal at the node N1 is high in logic and the read enable signal oe is high in logic, the NAND gate G3 outputs a high logic signal to the inverter G4. As a result, the inverter G4 applies a low logic signal to a gate of the pull-down NMOS transistor MN1 to turn it off. The low logic signal at the node N2 is applied to a gate of the pull-up PMOS transistor MP1 to turn it on. As the pull-up PMOS transistor MP1 is turned on, it transfers a high logic signal to a node N4.

The high logic signal at the node N4 is transferred to an output terminal dq. The high logic signal at the node N4 is also transferred to the NAND gate G5 in the data input buffer 12. Then in the data input buffer 12, the NAND gate G5 outputs a low logic signal to the inverter G6 when a write enable signal we is high in logic. As a result, the inverter G6 outputs a high logic signal to a node N5.

In the data register 21, the NMOS transistor MN2 is turned on when the write enable signal we is high in logic. When turned on, the NMOS transistor MN2 transfers the high logic signal at the node N5 to a node N6. The high logic signal at the node N6 is delayed by the inverters G7 to G10 and then transferred to a node N8. In this manner, the data register 21 acts as a time delay circuit or a buffer for temporarily storing the data signal from the node N5.

The signal at the node N8 or the output signal from the data register 21 is transferred to the multiplexer 22. Then in the multiplexer 22, the NMOS transistor MN4 is turned on when the multiplex control signal mux is low in logic. When turned on, the NMOS transistor MN4 transfers the signal at the node N8 or the data signal stored in the data register 21 to the node N1. The signal at the node N1 turns the PMOS transistor MP1 on. As a result, the read data signal is externally outputted through the output terminal dq.

Figure 3:
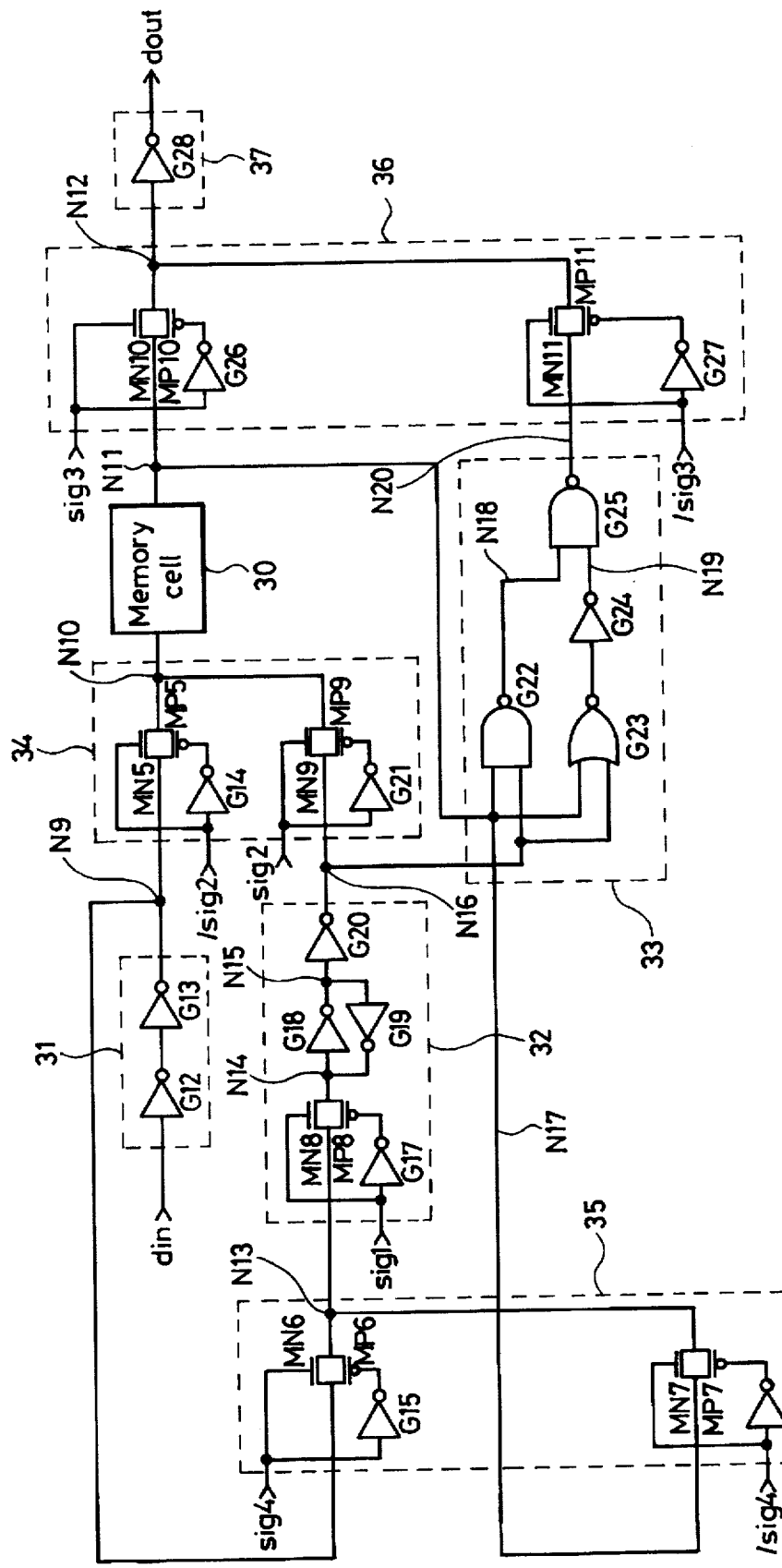
FIG. 3 is a partially detailed circuit diagram of a semiconductor memory device in accordance with an alternative embodiment of the present invention.

Referring to FIG. 3, there is shown a partially detailed circuit diagram of a semiconductor memory device in accordance with an alternative embodiment of the present invention. As shown in this drawing, the semiconductor memory device comprises a data input buffer 31 connected between a data input terminal din and a first multiplexer 34. The data input buffer 31 acts to transfer input data from the input terminal din to a memory cell array 30 and a data register 32 through the first multiplexer 34.

The data register 32 includes PMOS and NMOS transistors MP8 and MN8 connected between nodes N13 and N14, and an inverter G17 for inverting a control signal sig1 and applying the inverted control signal to a gate of the PMOS transistor MP8. The PMOS and NMOS transistors MP8 and MN8 are operated in response to the control signal sig1. The data register 32 further includes a memory cell for temporarily storing the input data from the input terminal din. To this end, the memory cell is provided with two inverters G18 and G19 connected in parallel between the node N14 and a node N15. The data register 32 further includes an inverter G20 connected between the node N15 and a node N16. The memory cell of the data register 32 stores the output data from the data input buffer 31 or the memory cell array 30 until it inputs the subsequent data.

The first multiplexer 34 acts to select one of the output data from the data input buffer 31 and the data stored in the data register 32 and transfers the selected data to the memory cell array 30. To this end, the first multiplexer 34 includes PMOS and NMOS transistors MP5 and MN5 connected between nodes N9 and N10, and an inverter G14 for inverting a control signal /sig2 and applying the inverted control signal to a gate of the PMOS transistor MP9. The PMOS and NMOS transistors MP5 and MN5 are operated in response to the control signal/sig2 to transfer the output data from the data input buffer 31 to the memory cell array 30. The first multiplexer 34 further includes PMOS and NMOS transistors MP9 and MN9 connected between the nodes N10 and N16, and an inverter G21 for inverting a control signal sig2 and applying the inverted control signal to a gate of the PMOS transistor MP9. The PMOS and NMOS transistors MP9 and MN9 are operated in response to the control signal sig2 to transfer the output data from the data register 32 to the memory cell array 30. The control signals /sig2 and sig2 are complementary to each other to necessarily turn on any one of the two transistors MN5 or MP5 and MN9 or MP9.

The semiconductor memory device further comprises a second multiplexer 35 for selecting one of the input data from the data input terminal din and the output data from the memory cell array 30 and transferring the selected data to the data register 32. To this end, the second multiplexer 35 includes PMOS and NMOS transistors MP6 and MN6 connected between the nodes N9 and N13, and an inverter G15 for inverting a control signal sig4 and applying the inverted control signal to a gate of the PMOS transistor MP6. The PMOS and NMOS transistors MP6 and MN6 are operated in response to the control signal sig4 to transfer the output data from the data input buffer 31 to the data register 32. The second multiplexer 35 further includes PMOS and NMOS transistors MP7 and MN7 connected between the node N13 and a node N17, and an inverter G16 for inverting a control signal /sig4 and applying the inverted control signal to a gate of the PMOS transistor MP7. The PMOS and NOS transistors MP7 and MN7 are operated in response to the control signal /sig4 to transfer the output data from the data input buffer 31 to a comparator 33. The control signals sig4 and /sig4 are complementary to each other to necessarily turn on any one of the two transistors MN6 or MP6 and MN7 or MP7.

The semiconductor memory device further comprises a comparator 33 for comparing the output data from the data register 32 with that from the memory cell array 30. To this end, the comparator 33 includes a NAND gate G22 for inputting the output data from the data register 32 and the output data from the memory cell array 30, a NOR gate G23 for inputting the output data from the data register 32 and the output data from the memory cell array 30, an inverter G24 connected between an output terminal of the NOR gate G23 and a node N19, and a NAND gate G25 connected between a node N18 connected to an output terminal of the NAND gate G22 and a node N20. When a data value from the data register 32 is the same as that from the memory cell array 30, the comparator 33 outputs a high logic signal. On the contrary, in the case where a data value from the data register 32 is different from that from the memory cell array 30, the comparator 33 outputs a low logic signal. In other words, when the output data from the data register 32 and the output data from the memory cell array 30 are both high or low in logic, the comparator 33 outputs a high logic signal. In the case where only one of the output data from the data register 32 and the output data from the memory cell array 30 is low in logic, the comparator 33 outputs a low logic signal.

The semiconductor memory device further comprises a third multiplexer 36 for selecting one of the output data from the memory cell array 30 and the output data from the comparator 33 and transferring the selected data to a data output buffer 37. To this end, the third multiplexer 36 includes PMOS and NMOS transistors MP10 and MN10 connected between nodes N11 and N12, and an inverter G26 for inverting a control signal sig3 and applying the inverted control signal to a gate of the PMOS transistor MP10. The PMOS and NMOS transistors MP10 and MN10 are operated in response to the control signal sig3 to transfer the output data from the memory cell array 30 to the data output buffer 37. The third multiplexer 36 further includes PMOS and NMOS transistors MP11 and MN11 connected between the nodes N20 and N12, and an inverter G27 for inverting a control signal /sig3 and applying the inverted control signal to a gate of the PMOS transistor MP11. The PMOS and NMOS transistors MP11 and MN11 are operated in response to the control signal /sig3 to transfer the output data from the comparator 33 to the data output buffer 37. The control signals sig3 and/sig3 are complementary to each other to necessarily turn on any one of the two transistors MN10 or MP10 and MN11 or MP11.

The data output buffer 37 acts to transfer the output data from the memory cell array 30 or the output data from the comparator 33 to a data output terminal dour. To this end, the data output buffer 37 includes an inverter G28 connected between the node N12 and the data output terminal dout.

Therefore, the semiconductor memory device of the present invention has a cache memory function. In other words, in the normal case, the input data from the input terminal din is stored in the memory cell array 30 through the data input buffer 31 and the first multiplexer 34, and the data stored in the memory cell array 30 is externally outputted through the third multiplexer 36 and the data output buffer 37. In a specific case where the input data have the same values or a regularity, the second multiplexer 35 stores the data applied to the memory cell array 30 into the data register 32, and the first multiplexer 34 applies the data stored in the data register 32 again to the memory cell array 30. The comparator 33 compares the output data from the data register 32 with that from the memory cell array 30. When a data value from the data register 32 is the same as that from the memory cell array 30, the comparator 33 outputs a high logic signal. On the contrary, in the case where a data value from the data register 32 is different from that from the memory cell array 30, the comparator 33 outputs a low logic signal.

As apparent from the above description, the present invention provides the semiconductor memory device having the cache memory function. In a specific case, data applied to the memory cell array is temporarily stored in the data register. The data stored in the data register is again applied to the memory cell without inputting external data. For example, in a fast page mode, the data temporarily stored in the data register is outputted with no variation in a column address when the read operation is performed after the write operation. Therefore, the semiconductor memory device is high in its data output speed and prevents the occurrence of faulty data. Further, the data stored in the memory cell array is compared with that stored in the data register to facilitate a test mode operation of a semiconductor memory device such as a DRAM.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:
    a memory cell array for storing input data therein;
    a data output buffer for outputting the data stored in said memory cell array externally;
    an output terminal for transferring the output data from said data output buffer externally:
    a data input buffer for transferring the output data from said data output buffer to said memory cell array;
    data storage means for temporarily storing the transferred data from said data input buffer; and
    multiplexing means connected among said memory cell array, said data storage means and said data output buffer, for selecting one of the data stored in said memory cell array and the data stored in said data storage means and transferring the selected data to said data output buffer, wherein said multiplexing means selects the data stored in said memory cell array in the normal case and the data stored in said data storage means in a specific case where the input data to said memory cell array have a regularity.

2. A semiconductor memory device comprising:
    an input terminal for inputting data;
    a memory cell array for storing the input data from said input terminal;
    an output terminal for transferring the data stored in said memory cell array externally;

data storage means for temporarily storing the input data from said input terminal or output data from said memory cell array;

first multiplexing means for selecting one of the input data from said input terminal and output data from said data storage means and transferring the selected data to said memory cell array; and second multiplexing means for selecting one of the input data from said input terminal and the output data from said memory cell array and transferring the selected data to said data storage means.

3. A semiconductor memory device as set forth in claim 2, further comprising:

comparison means for comparing the output data from said data storage means with that from said memory cell array; and third multiplexing means for selecting one of the output data from said memory cell array and output data from said comparison means and transferring the selected data to said output terminal.

4. A semiconductor memory device as set forth in claim 3, wherein said comparison means outputs a high logic signal when the output data from said data storage means is the same as that from said memory cell array and a low logic signal when the output data from said data storage means is different from that from said memory cell array.

5. A semiconductor memory device as set forth in claim 3, further comprising:

a data input buffer for transferring the input data from said input terminal to said first multiplexing means; and a data output buffer for transferring output data from said third multiplexing means to said output terminal.

6. A semiconductor memory device as set forth in claim 2, wherein said first multiplexing means selects the output data from said data storage means in a specific case where the input data from said input terminal have a regularity.

7. A semiconductor memory device comprising:

a memory cell array for storing input data;

a data output buffer coupled to receive output data from the memory cell array;

a data output terminal coupled to the data output buffer to output the output data externally;

a data input buffer coupled to the data output buffer to receive the output data;

a temporary data storage unit coupled to the data input buffer and having a latching portion, the latching portion temporarily storing the output data in response to a write enable signal used to control write operations to the memory cell array; and a multiplexer having first and second inputs coupled respectively to the temporary data storage unit and the memory cell array and an output coupled to the output data buffer to selectively transfer to the output buffer either the data stored in the memory cell array or the data stored in the temporary data storage unit.

8. A semiconductor memory device as recited in claim 7, wherein the multiplexer selects the data stored in the temporary data storage unit for transfer to the output buffer in response to the input data stored in the memory cell array have a regularity.

* * * * *